United States Patent [19]

Nagahama

[11] 4,039,980
[45] Aug. 2, 1977

[54] VOLTAGE-CONTROLLED FILTER

[75] Inventor: Yasuo Nagahama, Hamamatsu, Japan

[73] Assignee: Nippon Gakki Seizo Kabushiki Kaisha, Japan

[21] Appl. No.: 600,086

[22] Filed: July 29, 1975

[30] Foreign Application Priority Data

July 30, 1974 Japan ................................ 49-87710
July 30, 1974 Japan ................................ 49-87711

[51] Int. Cl.² .................... H03H 7/04; H03H 13/00
[52] U.S. Cl. ............................. 333/70 R; 330/31; 330/86; 330/145
[58] Field of Search ................ 333/70 R, 70 CR, 74, 333/75, 17; 330/86, 145, 31, 21; 328/167

[56] References Cited

U.S. PATENT DOCUMENTS

| | | | |
|---|---|---|---|
| 3,229,228 | 1/1966 | Reynolds | 333/70 R |
| 3,469,213 | 9/1969 | Baker | 333/70 R |
| 3,643,173 | 2/1972 | Whitten | 330/31 |
| 3,793,593 | 2/1974 | Kennedy et al. | 330/21 |
| 3,805,177 | 4/1974 | Risley | 330/86 |
| 3,911,776 | 10/1975 | Beigel | 333/70 R |

Primary Examiner—Alfred E. Smith
Assistant Examiner—David K. Moore
Attorney, Agent, or Firm—Spensley, Horn and Lubitz

[57] ABSTRACT

In a bridge circuit consisting of diodes connected in each circuit branch in a forward direction from one of a pair of opposing terminals to another with a current flowing through these diodes, impedance between a second opposing pair of terminals varies in correspondence to the magnitude of the constant current. The invention utilizes this phenomenon and provides a voltage-controlled filter employing this bridge circuit as an impedance element for determining its frequency region and thereby being capable of controlling its frequency region by voltage controlling. A primary passive low-pass filter is described as a preferred example of the invention. The invention further provides a voltage-controlled filter having the bridge circuit provided in a negative feedback loop of an amplifier in an active filter circuit and thereby being capable of controlling selectivity Q by controlling the gain of the amplifier by voltage controlling. As a preferred example of this type of filter, a secondary active low-pass filter is described.

3 Claims, 5 Drawing Figures

VOLTAGE-CONTROLLED FILTER

This invention relates to a voltage-controlled filter capable of variably controlling its filtering characteristics in response to change in voltage.

In an electronic musical instrument, a desired tone color can be provided to a musical tone signal of a certain pitch by changing relationship between harmonic contents contained in the musical tone signal. It is accordingly possible to change the tone color of a musical tone signal by using a voltage-controlled type filter in which the cut-off frequency of the filter is changed in response to the change in the control voltage. An even subtler control of the tone color can be achieved by changing not only the cut-off frequency but also selectivity Q of the filter.

It is therefore an object of the present invention to provide a voltage-controlled filter capable of variably controlling is cut-off frequency (or its center frequency) by utilizing a balanced diode bridge to change apparent resistance to an AC small signal of the diode bridge in response to the change in control voltage.

It is another object of the invention to provide a voltage-controlled filter capable of variably controlling selectivity Q in response to the control voltage by changing apparent resistance of a balanced diode bridge in response to the control voltage and thereby changing the amount of feedback of an amplifier provided in the active filter to change the gain of the amplifier.

The invention will now be described with reference to preferred embodiments of the invention illustrated in the accompanying drawings in which.

Figure 1:
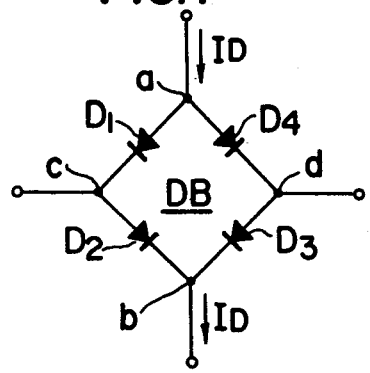
FIG. 1 is a schematic circuit diagram showing an equivalent impedance circuit used in the voltage-controlled filter according to the invention.

FIG. 1 is a schematic circuit diagram showing equivalent impedance circuit used in the voltage-controlled filter according to the invention. A diode bridge DB is composed of four diodes $D_1 - D_4$ of the same characteristics. A current (current from a very high impedance source) $I_D$ flows through these diodes $D_1 - D_4$ in a forward direction from a terminal a to a terminal b. The value of the current $I_D$ is determined in accordance with an input control voltage applied for variably controlling a characteristic of the filter. A forward current of $I_D/2$ flows through the diodes $D_1 - D_4$ and forward voltage corresponding to the forward current $I_D/2$ is produced. Accordingly, the bridge DB is completely balanced at terminals C and d.

Figure 2:
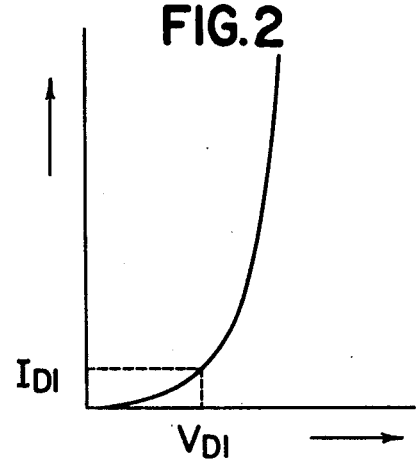
FIG. 2 is a diagram showing a characteristic of each diode used in the equivalent impedance circuit shown in FIG. 1.

According to the present invention, apparent resistance of the diode bridge DB is changed by utilizing non-linearity of the forward characteristics of the diodes $D_1 - D_4$ as shown in FIG. 2. In the figure, forward voltage $VD_1$ corresponds to forward current $I_{D1}$. A reciprocal of the inclination at this point represents the apparent resistance. Accordingly, an AC signal is produced at the terminal d in accordance with the apparent resistance by applying an AC signal at the terminal c. Thus, an equivalent impedance circuit is formed between the terminals c and d. Since this equivalent impedance varies in inverse proportion to the current $I_D$, a CR filter circuit can be composed by combining this equivalent impedance circuit with a suitable capacitance element.

Figure 3:
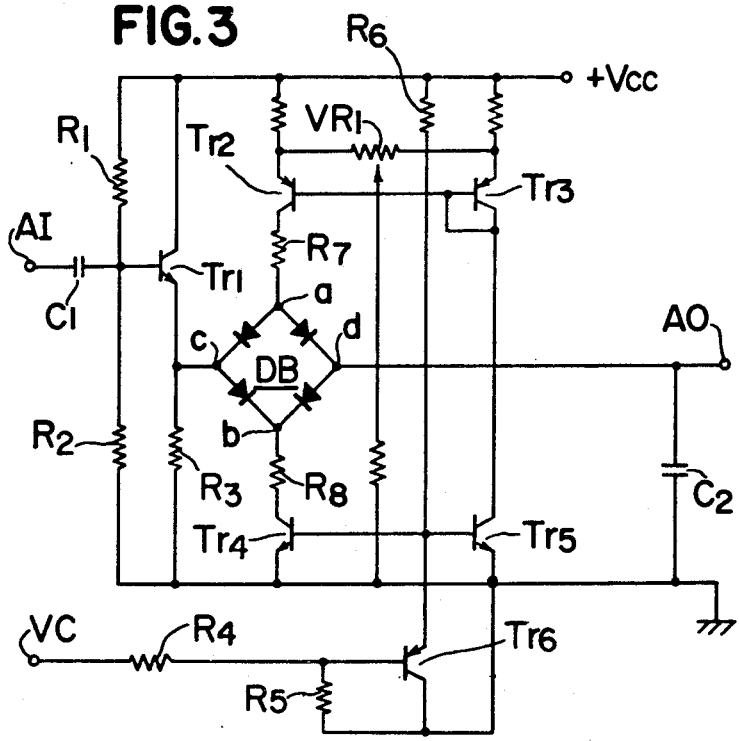
FIG. 3 is a circuit diagram showing one preferred embodiment of the voltage-controlled filter according to the invention.

FIG. 3 shows one embodiment of the voltage-controlled filter according to the invention. The present embodiment is constituted in the form of a low-pass filter circuit capable of varying the cut-off frequency in response to the control voltage. An incoming musical tone signal applied to an input terminal AI is fed to a terminal c of the diode bridge DB through a coupling condenser $C_1$ and an emitter-follower transistor $Tr_1$. The emitter-follower transistor $Tr_1$ is provided to serve as a buffer amplifier for maintaining a DC impedance balance at the terminal c. Values of resistance of resistors $R_1$, $R_2$ and $R_3$ are selected at values which are suitable for maintaining DC balancing (e.g. $R_1 = R_2 = R_3$). This low-pass filter is constructed of the equivalent impedance circuit consisting of the diode bridge DB and a capacitance element consisting of condenser $C_2$ connected between the terminal d and ground. Accordingly, harmonic contents in a high frequency region as beyond a cut-off frequency $$f_c = \frac{1}{2 \pi CR},$$

where R represents the equivalent impedance and C the capacitance, have been removed from the musical tone signal output from an output terminal AO.

Control voltage for variably controlling the cut-off frequency is applied to a control voltage input terminal VC. A variable current controlled by this control voltage flows through the diode bridge DB. In the present embodiment, the value of the current is determined in proportion to exponential function of the control voltage. It is convenient in a voltage curcuit (not shown) provided for generating the control voltage to indicate the cut-off frequency by a logarithmic indication and produce the control voltage logarithmically relative to the cut-off frequency, because this arrangement affords a wider range of variation in the cut-off frequency. Accordingly, a cut-off frequency as indicated on an indicator is actually produced even though the control voltage is logarithmically produced.

The control voltage applied to the terminal VC is divided by resistors $R_4$ and $R_5$ ($R_4 >> R_5$) into a small voltage in the order of mV unit and this small voltage is used as base voltage of a transistor $Tr_6$. The transistor $Tr_6$ is provided for temperature compensation of the base-emitter of transistors $Tr_2 - Tr_5$ which provide the diode bridge DB with the constant current. The emitter of the transistor $Tr_6$ is connected to the bases of the transistors $Tr_4$ and $Tr_5$. A resistor $R_6$ having a large value of resistance (e.g. 10 M $\Omega$) is connected between the emitter of the transistor $Tr_6$ and power source +Vcc to form a constant current circuit. Accordingly, the base voltage of the npn transistors $Tr_4$ and $Tr_5$ are controlled by the control voltage applied to the terminal VC, and a sum of a potential of the resistor $R_5$ to ground and the base-emitter voltage of the transistor $Tr_6$ becomes the base voltage of the transistors $Tr_4$ and $Tr_5$.

In response to this base voltage, an equal collector current flows through the transistors $Tr_4$ and $Tr_5$. Since this base voltage becomes a forward base-emitter voltage of the transistors $Tr_4$ and $Tr_5$ the collector current varies in proportion to exponential function of the base voltage due to the forward base-emitter characteristics. Accordingly, the collector current which varies in proportion to the exponential function of the control voltage flows through the transistors $Tr_4$ and $Tr_5$.

The transistors $Tr_2 - Tr_5$ constitute a current mirror circuit, the value of the collector current flowing through the transistors $Tr_3$ and $Tr_5$ being equal to that of the collector current flowing through the transistors $Tr_2$ and $Tr_4$. More specifically, the collectors of the transistors $Tr_3$ and $Tr_5$ being connected in common connection, so that the same collector current flows these transistors $Tr_2$ and $Tr_5$, whereas the pnp transistors $Tr_3$ and $Tr_2$ are equally biased with a result that the same collector current flows through line transistors $Tr_3$ and $Tr_2$. Accordingly, the collector current flowing through the transistor $Tr_2$ is equal to that flowing through the transistor $Tr_4$, that is, the current flowing from the collector of the transistor $Tr_2$ to the terminal a of the diode bridge DB through a resistor $R_7$ is equal to the current flowing from the terminal b to the collector of the transistor $Tr_4$ through a resistor $R_8$. In the foregoing manner, a variable current proportionate to the exponential function of the control voltage flows from the terminal a to the terminal b in a forward direction through the respective diodes.

The values of resistance of the resistors $R_7$ and $R_8$ are made equal to each other to maintain impedance balance between the terminals c and d. While an input musical tone signal is not applied, a DC impedance balance is maintained at the terminals c and d and the other circuit portion such as the transistor $Tr_1$ and the resistor $R_3$ is separated from the terminals c and d. A variable resistor $VR_1$ is connected to the emitters of the transistors $Tr_2$ and $Tr_3$ to maintain balance of bias of the transistors $Tr_2$ and $Tr_3$.

Assume that the current $I_{D1}$ determined by the control voltage is flowing through each diode of the diode bridge DB. The forward voltage of each diode is $V_{D1}$ as shown in FIG. 2 and the equivalent impedance produced by the diode bridge DB is a reciprocal of the inclination at the crossing point of $I_{D1}$ and $V_{D1}$. If a musical tone signal is applied to the input terminal AI under this condition, the voltage at the terminal c of the diode bridge DB fluctuates in an AC manner in response to the applied musical tone signal. Since the diode bridge DB is balanced, the voltage at the terminal d also fluctuates in response to the fluctuation at the terminal c, and the musical tone signal is fed to the condenser $C_2$ through the equivalent impedance circuit.

As has been described in the foregoing, the cut-off frequency $f_c$ is determined by the equivalent impedance R and the capacitance C of the condenser $C_2$. The cut-off frequency therefore is proportional to reciprocal of the equivalent impedance R and varies in proportion to the current flowing through each diode of the diode bridge DB. Accordingly, the cut-off frequency is variably controlled in proportion to the exponential function of the control voltage.

The foregoing embodiment has been described with reference to a first-order passive low-pass filter circuit. The invention is not limited to this but a filter circuit of a higher order constructed of suitable equivalent impedance circuit consisting of a diode bridge and a capacitance element may be effectively used.

It will also be apparent to those skilled in the art from the foregoing description that a high-pass filter circuit or a band-pass filer circuit may be constructed of a suitable equivalent impedance circuit consisting of a diode bridge and a capacitance element for variably controlling the cut-off or center frequency.

If one desires to provide musical tone signals of different pitches with the same tone color, voltage which is proportional to the pitch of the musical tone signal applied to the input terminal AI is added to the base of the transistors $Tr_4$ and $Tr_5$ to shift the filtering frequency range (the cut-off frequency) of the entire filter in accordance with the pitch of the musical tone signal.

The selectivity Q of the filter can be changed by using the diode bridge consisting the equivalent impedance circuit as shown in FIG. 1. More specifically, the equivalent impedance is changed by inserting the diode bridge as shown in FIG. 1 in negative feedback circuit of an amplifier and thereby changing the current $I_D$. This changes the amount of feedback and therefore gain of the amplifier. An active filter can be constructed by employing this amplifier as an active element and inserting a frequency selection circuit consisting of a resistance element and a capacitance element in positive feedback loop of the amplifier. The selectivity Q of the filter is changed in response to the change of the gain of the amplifier.

Figure 4:
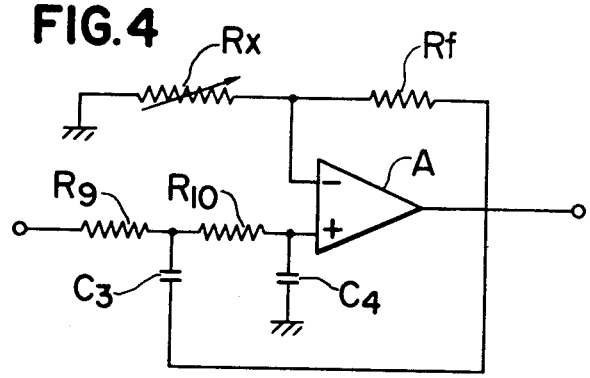
FIG. 4 is a circuit diagram showing an example of a secondary active low-pass filter adapted to change the selectivity of the filter.

The change of the selectivity Q will be described with reference to a second order active low-pass filter shown in FIG. 4. An equivalent impedance Rx composed of a diode bridge is inserted in a negative feedback circuit of an amplifier A. Gain Gc of this amplifier A is $$Gc = 1 + \frac{R_f}{R_x}.$$

A frequency selection circuit consisting of resistors $R_9$, $R_{10}$ and condensers $C_3$, $C_4$ is inserted in a positive feedback circuit of the amplifier A. The selectivity Q is obtained by the following equation:

$$Q = \frac{\sqrt{C_3 \cdot C_4} \cdot \sqrt{R_9 \cdot R_{10}}}{(1 - Cc) C_3 \cdot R_9 + C_3 (R_9 + R_{10})} \tag{1}$$

Since the selectivity Q changes in response to the change of the gain Gc, the selectivity Q is variably controlled in response to the control voltage.

Figure 5:
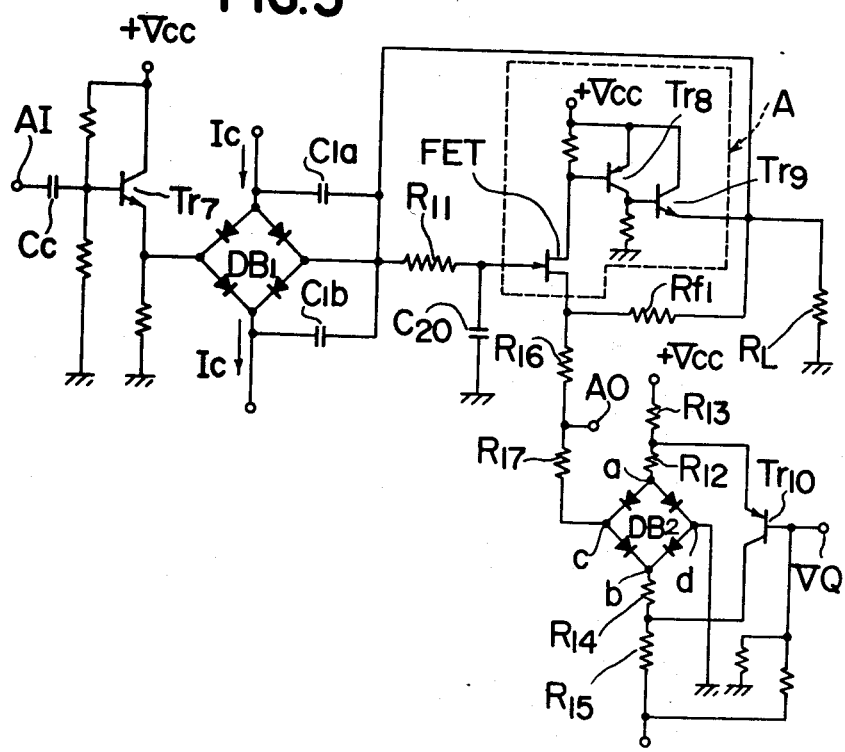
FIG. 5 is a circuit diagram showing another preferred embodiment of the voltage-controlled filter according to the invention.

FIG. 5 is a circuit diagram showing a second-order active low-pass filter capable of changing the selectivity Q in response to a first control voltage and also changing the cut-off frequency in response to a second control voltage. An incoming musical tone signal applied to an input terminal AI is fed to an emitter-follower transistor $Tr_7$ through a coupling condenser Cc. The output of the transistor $Tr_7$ is supplied to a condenser $C_{20}$ through an equivalent impedance circuit consisting of diode bridge $DB_1$. A variable current Ic flows through this diode bridge $DB_1$ for controlling the cut-off frequency of the filter. The current Ic/2 flows in a forward direction through each diode of the diode bridge $DB_1$ in response to a control voltage for variably controlling the cut-off frequency and an equivalent impedance circuit is formed by a pair of terminals on the sides of the transistor $Tr_7$ and the condenser $C_{20}$. For changing the current Ic in response to the control voltage, a circuit as shown in FIG. 3 may be employed. Accordingly, detailed illustration of such circuit is omitted in FIG. 5, As the current Ic increases, an apparent resistance, i.e., an equivalent impedance, decreases and the cut-off frequency increases. The output of the diode bridge $DB_1$ is applied to the gate of a field-effect transistor FET through a resistor $R_{11}$ and the grounded condenser $C_{20}$. An amplifier is constructed of this field-effect transistor FET and transistor $Tr_8$ and $Tr_9$ connected to the drain of the field-effect transistor FET. This amplifier constitutes the active element in the active filter (the amplifier A in FIG. 4).

The output of this amplifier is fed back to its input from the emitter of the transistor $Tr_9$ through condensers $C_{1a}$ and $C_{1b}$. Comparing this frequency selection circuit portion with the circuit shown in FIG. 4, the output impedance of the emitter-follower transistor $Tr_7$ corresponds to the resistor $F_9$, the condensers $C_{1a}$ and $C_{1b}$ to the condenser $C_3$, the equivalent impedance of the diode bridge $DB_1$ to the resistor $R_{10}$ and the condenser $C_{20}$ to the condenser $C_4$ respectively.

If, accordingly, a signal of a much higher frequency than the cut-off frequency which is controlled by the equivalent impedance produced by the diode bridge $DB_1$ is applied to the input terminal AI, the frequency selection circuit operates as a secondary passive low-pass filter consisting of the output impedance of the transistor $Tr_7$, the equivalent impedance of the diode bridge $DB_1$, condenser $C_{1a}$ ($C_{1b}$) and the condenser $C_{20}$. If, on the other hand, a signal of a frequency which is in the vicinity of the cut-off frequency is applied, these impedance and capacitance elements operate as an active band-pass filter having the selectivity Q. This selectivity Q is controlled in response to the change in the gain of the amplifier consisting of the field-effect transistor FET and the transistors $Tr_8$ and $Tr_9$, as has previously been described.

The field-effect transistor FET and the transistors $Tr_8$ and $Tr_9$ constitute a positive-phase amplifier and a load resistance $R_L$ is connected to the emitter-follower output of this amplifier. A feedback circuit is composed of a resistor $R_{f1}$ connected between the emitter of the transistor $Tr_9$ and the source of the field-effect transistor FET and a group of resistors (including resistors $R_{16}$, $R_{17}$ and a diode bridge $DB_2$) connected between the source of the field-effect transistor FET and ground. A total value of resistance of this group of resistors is designated by a reference characters $R_{x1}$. Amount of negative feedback $\beta$ is determined by the equation $$\beta = \frac{R_{x1}}{R_{x1} + R_{f1}}.$$

Accordingly, the gain Gc of the amplifier becomes $$Gc = 1 + \frac{R_{f1}}{R_{x1}} \quad (2)$$

It will be noted from this equation that the gain of the amplifier can be changed by changing the resistance $R_{x1}$.

According to the present invention, the gain is changed by changing the apparent resistance of the diode bridge $DB_2$. The control voltage for variably controlling the selectivity Q is applied to a control voltage input terminal VQ. The variable current controlled by this control voltage flows through the diode bridge $DB_2$.

The control voltge applied to the input terminal VQ is applied to the base of a transistor $Tr_{10}$ and current corresponding to the control voltage flows through the emitter and the collector of the transistor $Tr_{10}$. A positive power voltage +Vcc is applied to a terminal a of the diode bridge $DB_2$ through resistors $R_{13}$ and $R_{12}$ and a negative power voltage $-V_{EE}$ is applied to a terminal b through resistors $R_{14}$ and $R_{15}$. Accordingly, the constant current flows between the terminals a and b in a forward direction through each diode. The emitter and collector of the transistor $Tr_{10}$ are connected in parallel to the diode bridge $DB_2$ and the current flowing through the diode bridge $DB_2$ is controlled by controlling the current flowing between the emitter and collector of the transistor $Tr_{10}$. The values of resistance of the resistors $R_{13}$ and $R_{12}$ are equal to each other and the values of resistance of the resistors $R_{14}$ and $R_{15}$ are equal to each other, whereby impedance at a pair of terminals c and d of the diode bridge $DB_2$ is balanced. The transistor $Tr_{10}$ operates in the active region.

If the control voltage is caused to decrease to bring the transistor $Tr_{10}$ into a state which is very near the cut-off state, the current flowing through the diode bridge $DB_2$ increases and the apparent resistance between the terminals c and d, i.e., the equivalent impedance decreases. If, on the contrary, the control voltage is caused to increase, the collector current of the transistor $Tr_{10}$ increases and the current flowing through the bridge $DB_2$ decreases resulting in increase in the equivalent impedance.

Accordingly, the resistance $R_{x1}$ varies with the equivalent impedance of the diode bridge $DB_2$ with a resulting variation in the amount of negative feedback of the amplifier. From the above described equation (2), the amplifier gain Gc increases as the current flowing through the diode bridge $DB_2$ increases (i.e., as the equivalent impedance decreases), and the gain Gc decreases as the current decreases (i.e., as the equivalent impedance increases). In the foregoing description, "plus 1" in the equation (2) is neglected because 1 - Gc in the equation (1) leaves $F_{f1}/R_{x1}$ and gain Gc affecting the selectivity Q substantially becomes $R_{f1}/R_{x1}$. As will be apparent from the foregoing description and the equation (1) the selectivity Q can be variably controlled in response to the amplifier gain.

In sum, the constant current flowing through the diode bridge $DB_2$ varies in response to the control voltage, and the gain of the amplifier varies in response to the variation of the current with a result that the selectivity Q is variably controlled by the control voltage. The output of the filter may also be taken out of a terminal AO provided in the feedback circuit. Furthermore, a resistor (not shown) may be inserted between the terminals a and b of the diode bridge $DB_2$ for dividing the current and thereby reducing the value of the constant current flowing through each diode so as to allow the most desirable portion of the forward characteristic curve of the diode to be utilized.

In the embodiment shown in FIG. 5, the cut-off frequency is changed by the diode bridge $DB_1$ and the selectivity Q is variably controlled, by the diode bridge $DB_2$. The invention, however, is not limited to this but it is possible to change the selectivity Q only, maintaining the cut-off frequency at a constant value. In this latter case, the diode bridge $DB_1$ may be constructed of normal resistance elements. It will be apparent to those skilled in the art that not only in a low-pass filter but also in a high-pass filter or a band-pass filter, the equivalent impedance circuit consisting of a diode bridge may be inserted in the feedback circuit of the amplifier for variably constrolling the amount of feedback and thereby variably controlling the selectivity Q through variation in the amplifier gain responsive to the variation in the control voltage.

In the embodiment shown in FIG. 5, a resistor $R_{11}$ is connected to the gate input of the field-effect transistor FET. This resistor $R_{11}$ which is of a relatively small value of resistance in the order of approximately 10Ω to 90Ω is provided for stabilization of the filter circuit. As has been described above, the cut-off frequency is changed in the embodiment shown in FIG. 5, If the cut-off frequency is selected at a relatively high point, the equivalent impedance of the diode bridge $DB_1$ (corresponding to the resistor $R_4$ is FIG. 4) becomes very low and approaches the value of the output impedance of the transistor $Tr_7$ (corresponding to the resistor $R_9$ in FIG. 4). It should be noted that in a normal case (i.e., when the cut-off frequency is not so high) the output impedance of the transistor $Tr_7$ is negligibly small as compared with the equivalent impedance of the diode bridge $DB_1$. Accordingly, the variation in the ratio of resistance of the resistor $R_9$ to resistance of the resistor $R_{10}$ in the equation (1) is almost negligibly small. If, however, the cut-off frequency is relatively high, the output impedance of the transistor $Tr_7$ is unnegligible since in this case the ratio of resistance of the resistor $R_9$ to resistance of the resistor $R_{10}$ is appreciably different from the normal case. This increases the selectivity Q to such an extent that the filter circuit will become unstable and, in an extreme case, it will start oscillation.

To eliminate the above described disadvantage, the resistor $R_{11}$ os small resistance is connected in series to the equivalent impedance circuit consisting of the diode bridge $DB_1$. If the cut-off frequency is low, the resistor $R_{11}$ can be neglected due to the large equivalent impedance and the selectivity Q is hardly affected by the resistor $R_{11}$. As the cut-off frequency increases, the resistor $R_{11}$ excercises its influence over the output impedance of the transistor $Tr_7$, causing the gain of the amplifier including the transistor FET, $Tr_8$ and $Tr_9$ to decrease equivalently. This causes the selectivity Q to decrease so that occurrence of oscillation in the filter circuit is effectively prevented even in the case of a high cut-off frequency.

What is claimed is:

1. A voltage controlled filter comprising:
   a variable current circuit for supplying current of a value which is determined in proportion to the exponential function of a control voltage;
   an equivalent impedance circuit including diodes connected in the form of a bridge in a forward direction from one terminal of a first pair of opposing terminals to another terminal and providing an equivalent impedance determined by the value of said current flowing through said diode at a second pair of opposing terminals, a signal to be filtered being applied to one terminal of said second pair of opposing terminals; and
   a capacitor element connected to another terminal of said second pair of opposing terminals whereby the filtering frequency region is variably controlled in response to the magnitude of said control voltage.

2. A voltage controlled filter comprising:
   an amplifier;
   an equivalent impedance circuit provided in a negative feedback loop of said amplifier including diodes connected in the form of a bridge in a forward direction from one of a first opposing pair of terminals to another and providing an equivalent impedance corresponding to the value of a current flowing through said diodes at a second pair of opposing terminals;
   a variable current circuit for supplying said equivalent impedance circuit with a current of a value which is determined in proportion to the exponential function of the value of a control voltage; and
   a frequency selecting circuit provided in a positive feedback circuit of said amplifier;
   the gain of said amplifier being changed in response to said control voltage whereby selectivity Q is variably controlled.

3. A voltage controlled filter as defined in claim 2 wherein said frequency selection circuit comprises:
   a variable current circuit for supplying current of a value which is determined in proportion to the exponential function of a second control voltage;
   an equivalent impedance circuit including diodes connected in each circuit branch in a forward direction from one terminal of a first pair of opposing terminals to another terminal providing an equivalent impedance corresponding to the value of said current flowing through said diodes at a second pair of opposing terminals, a signal to be filtered being applied to one terminal of said second pair of opposing terminals; and
   a capacitance element connected to another terminal of said second pair of opposing terminals; and
   wherein a filtering frequency region is variably controlled in response to variation in said second control voltage.

* * * * *